US010727277B2

(12) United States Patent
Murakami et al.

(10) Patent No.: US 10,727,277 B2
(45) Date of Patent: Jul. 28, 2020

(54) STORAGE DEVICE

(71) Applicant: Toshiba Memory Corporation, Minato-ku, Tokyo (JP)

(72) Inventors: Yosuke Murakami, Yokkaichi Mie (JP); Takeshi Ishizaki, Nagoya Aichi (JP); Yusuke Arayashiki, Yokkaichi Mie (JP); Kazuhiko Yamamoto, Fujisawa Kanagawa (JP); Kana Hirayama, Yokkaichi Mie (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 16/279,971

(22) Filed: Feb. 19, 2019

(65) Prior Publication Data

US 2020/0083295 A1    Mar. 12, 2020

(30) Foreign Application Priority Data

Sep. 10, 2018    (JP) ................................. 2018-168742

(51) Int. Cl.
*G11C 11/00*    (2006.01)
*H01L 27/24*    (2006.01)
*H01L 45/00*    (2006.01)

(52) U.S. Cl.
CPC ...... *H01L 27/2481* (2013.01); *H01L 27/2454* (2013.01); *H01L 45/1246* (2013.01); *H01L 45/1253* (2013.01); *H01L 45/145* (2013.01)

(58) Field of Classification Search
CPC ............. H01L 27/2481; H01L 27/2454; H01L 45/1246; H01L 45/1253
USPC ................................................. 365/129–188
See application file for complete search history.

(56) References Cited

U.S. PATENT DOCUMENTS

| | | | | |
|---|---|---|---|---|
| 8,437,173 | B2* | 5/2013 | Hayakawa | G11C 13/0007 257/3 |
| 8,861,257 | B2* | 10/2014 | Hayakawa | H01L 27/101 365/100 |
| 9,754,665 | B2 | 9/2017 | Chen et al. | |
| 2012/0063201 | A1* | 3/2012 | Hayakawa | G11C 13/0007 365/148 |
| 2013/0010529 | A1* | 1/2013 | Hayakawa | H01L 27/101 365/148 |
| 2014/0185360 | A1* | 7/2014 | Kawai | G11C 13/0007 365/148 |
| 2017/0005262 | A1 | 1/2017 | Hwang et al. | |
| 2017/0062713 | A1 | 3/2017 | Takagi et al. | |

\* cited by examiner

*Primary Examiner* — Harry W Bryne
(74) *Attorney, Agent, or Firm* — Foley & Lardner LLP

(57) ABSTRACT

A storage device includes a first conductor, a resistance variable film, and a second conductor. The resistance variable film includes a first layer and a second layer. The second layer is located on a side opposite to the first conductor with respect to the first layer, contains oxygen, and has conductivity higher than that of the first layer. The second conductor includes a first portion and a second portion. The first portion abuts on the second layer of the resistance variable film. The second portion is separated from the resistance variable film as compared to the first portion. The oxygen content of the first portion is higher than that of the second portion.

20 Claims, 6 Drawing Sheets

STORAGE DEVICE

CROSS-REFERENCE TO RELATED APPLICATION

This application is based upon and claims the benefit of priority from Japanese Patent Application No. 2018-168742, filed Sep. 10, 2018, the entire contents of which are incorporated herein by reference.

FIELD

Embodiments described herein relate generally to a storage device.

BACKGROUND

A storage device is proposed in which a resistance variable film is connected between two kinds of wirings extending in a direction orthogonal to each other.

DETAILED DESCRIPTION

Figure 1:
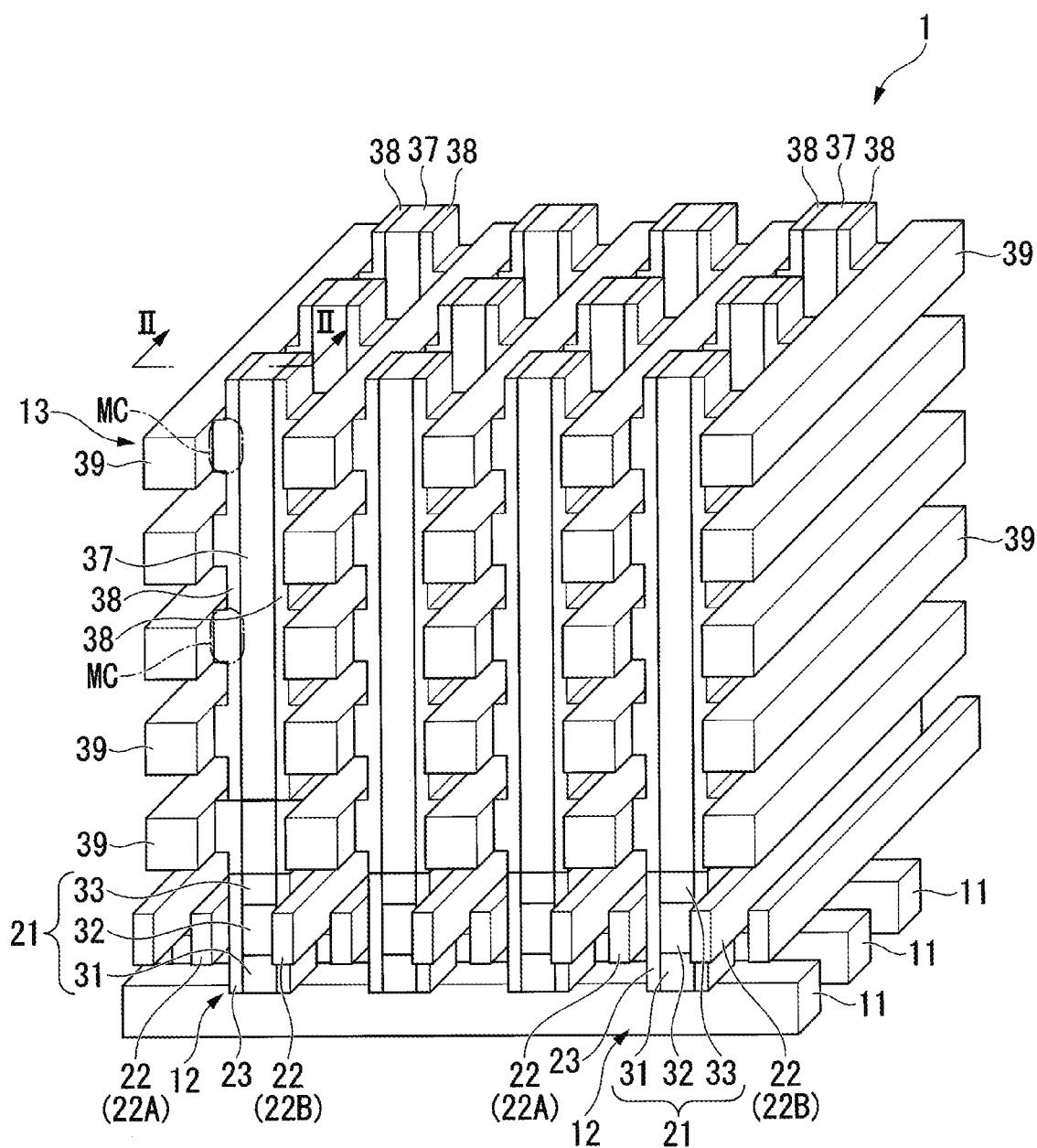
FIG. 1 is a perspective view schematically illustrating a storage device according to at least one embodiment.
Figure 1:
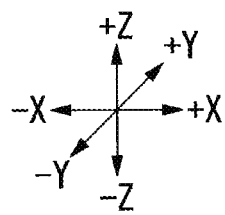

At least one embodiment provides a storage device which achieves power saving.

In general, according to at least one embodiment, the storage device includes a first conductor, a resistance variable film, and a second conductor. The resistance variable film includes a first layer and a second layer. The second layer is located on a side opposite to the first conductor with respect to the first layer, contains oxygen, and has conductivity higher than that of the first layer. The second conductor includes a first portion and a second portion. The first portion abuts on the second layer of the resistance variable film. The second portion is separated from the resistance variable film as compared to the first portion. The oxygen content of the first portion is higher than that of the second portion.

Hereinbelow, the storage device of the embodiments will be described with reference to the drawings. In the description below, the configurations having the same or similar functions are attached with the same symbol. Then, the redundant descriptions of the configurations may be omitted. The drawings are given schematically or conceptually. A relation between the thicknesses and widths of the portions and a ratio of the magnitudes among the portions are not necessarily the exact same as the real dimensions.

In the specification, the expression "connection" is not limited to a physical connection, and may also be an electrical connection. In other words, the expression "connection" is not limited to the direct connection between two members. Another member may be interposed between the two members. On the other hand, the expression "to abut" means "to direct abut". In the specification, the expressions "to overlap" and "to face" are not limited to a case where two members directly face each other. Another member may be interposed between the two members. In addition, the expressions "to overlap" and "to face" may contain a case where two members are partially overlapped or face. In addition, the expression "thickness" is given for convenience, and may be rewritten with "dimension".

In addition, first a +X direction, a −X direction, a +Y direction, a −Y direction, a +Z direction, and a −Z direction will be defined. The +X direction is a direction heading toward a resistance variable film 38 from a connection portion 51 of a certain word line 39 in the structure related to one memory cell MC described below (see FIG. 2). The +X direction is an example of a "first direction". The −X direction is a reverse direction to the +X direction. When the +X direction and the −X direction are not distinguished, it will be simply referred to as "X direction". The +Y direction and the −Y direction are directions intersecting with (for example, approximately orthogonal to) the X direction. The +Y direction and the −Y direction are opposite to each other. When the +Y direction and the −Y direction are not distinguished, it will be simply referred to as "Y direction". The +Z direction and the −Z direction are directions intersecting with (for example, approximately orthogonal to) the X direction and the Y direction. The +Z direction is a direction from a global bit line 11 toward a silicon member 21. The −Z direction is a reverse direction to the +Z direction. When the +Z direction and the −Z direction are not distinguished, it will be simply referred to as "Z direction". The +Z direction is an example of a "second direction". In the specification, the "+Z direction" may be referred to as "up", and the "−Z direction" may be referred to as "down". However, these expressions are given for convenience, but do not restrict the direction of gravity.

First Embodiment

FIG. 1 is a perspective view schematically illustrating a storage device 1 of at least one embodiment.

The storage device 1 is an example of a semiconductor storage device, and may be a resistance variable memory, for example. The storage device 1 includes, for example, a plurality of global bit lines 11, a plurality of TFTs 12, and a storage unit 13.

For example, the plurality of global bit lines 11 are formed by partitioning the upper layer portion of a silicon substrate (not illustrated) using an element isolation insulator (not illustrated). Alternatively, the plurality of global bit lines 11 are formed by depositing polysilicon on an insulating film (not illustrated) which is provided on the silicon substrate. Each global bit line 11 extends in the X direction. The plurality of global bit lines 11 are arranged in the Y direction with a gap therebetween.

The plurality of TFTs 12 is formed by, for example, a plurality of silicon members 21, a plurality of gate electrodes 22, and a plurality of gate insulating films 23. The TFT 12 is, for example, an n-channel transistor.

The plurality of silicon members 21 are disposed above each global bit line 11. The plurality of silicon members 21 corresponding to one global bit line 11 are arranged in the X direction with a gap therebetween. With this configuration, the plurality of silicon members 21 of the storage device 1 are arranged in a matrix configuration in the X direction and the Y direction with a gap therebetween.

Each silicon member 21 is formed in an approximately prismatic shape with the Z direction as a longitudinal direction. The lower end of the silicon member 21 is connected to the global bit line 11. In other words, the plurality of silicon members 21 arranged in the X direction are commonly connected to the same global bit line 11.

The silicon member 21 includes, for example, an n$^+$-type portion 31, a p$^-$-type portion 32, and an n$^+$-type portion 33. The n$^+$-type portion 31, the p$^-$-type portion 32, and the n$^+$-type portion 33 are stacked in this order from bottom to top. Further, the TFT 12 may be a p-channel transistor. In this case, a relation between the p type and the n type is reverse to that in the n-channel transistor described above.

The plurality of gate electrodes 22 includes a first gate electrode 22A located in the −X direction and a second gate electrode 22B located in the +X direction with respect to one silicon member 21. In the description below, when the first gate electrode 22A and the second gate electrode 22B are not distinguished, it will be simply referred to as the "gate electrode 22". Each gate electrode 22 extends in the Y direction. Each gate electrode 22 faces the plurality of silicon members 21 which are arranged in the Y direction. The gate electrode 22 faces part of the n$^+$-type portion 31, the entire p$^-$-type portion 32, and part of the n$^+$-type portion 33, among the silicon members 21, for example. The gate electrode 22 is formed of polysilicon, for example.

The gate insulating film 23 includes at least a portion located in the −X direction and a portion located in the +X direction with respect to one silicon member 21. The gate insulating film 23 is located between the silicon member 21 and the gate electrode 22. The gate insulating film 23 is formed of a silicon oxide, for example.

In this embodiment, each TFT 12 is formed by the silicon member 21, the pair of gate electrodes 22A and 22B, and the gate insulating film 23. The TFT 12 is a switching element which switches conduction and interruption of current between the global bit line 11 and a local bit line 37 of the storage unit 13 described below. Further, insulating films (not illustrated) are provided between the plurality of global bit lines 11, between the plurality of silicon members 21, and between the plurality of gate electrodes 22.

The storage unit 13 includes, for example, the plurality of local bit lines 37, the plurality of resistance variable films 38, and the plurality of word lines 39. The local bit line 37 is an example of the "first conductor". The word line 39 is an example of the "second conductor".

The local bit line 37 is provided above the silicon member 21, and extends in the Z direction. The plurality of local bit lines 37 is arranged in a matrix configuration in the X direction and the Y direction with a gap therebetween. Each local bit line 37 has almost the same shape as the silicon member 21 when viewed from the Z direction, and is formed in an approximately prismatic shape with the Z direction as a longitudinal direction. The lower end of the local bit line 37 is connected to the upper end of the silicon member 21.

The resistance variable film 38 is provided in the −X direction and the +X direction with respect to each local bit line 37. The resistance variable film 38 is located between the local bit line 37 and a plurality of word lines 39. The resistance variable film 38 is a film of which the resistance state varies according to voltage or current applied thereto.

The word line 39 is provided between two local bit lines 37 adjacent to each other in the X direction, and extends in the Y direction. The plurality of word lines 39 corresponding to one local bit line 37 are arranged in the Z direction with a gap therebetween. With this configuration, the plurality of word lines 39 of the storage device 1 are arranged in a matrix configuration with a gap therebetween in the X direction and the Z direction when viewed from the Y direction.

The local bit line 37 and the word line 39 are disposed to be intersected with each other (almost orthogonal to each other in this embodiment) when viewed from the X direction. In the intersecting portion between the local bit line 37 and the word line 39, the resistance variable film 38 is interposed between the local bit line 37 and the word line 39 in the X direction. Each intersecting portion between the local bit line 37 and the word line 39 forms the memory cell MC with the resistance variable film 38. With this configuration, a plurality of memory cells MC of the storage device 1 are arranged in a three-dimensional matrix configuration with a gap therebetween in the X direction, the Y direction, and the Z direction.

An interlayer insulating film 35 (see FIG. 2) is provided between the plurality of word lines 39. In other words, the plurality of word lines 39 and the plurality of interlayer insulating films 35 are alternately stacked in the Z direction. With this configuration, there is formed a stacked body LB which includes the plurality of word lines 39 and the plurality of interlayer insulating films 35. The interlayer insulating film 35 is formed of a silicon oxide, for example. The interlayer insulating film 35 is an example of an "insulating film". Further, an insulating film (not illustrated) is provided even between the plurality of local bit lines 37 adjacent in the Y direction in.

Next, the configurations of the local bit line 37, the resistance variable film 38, and the word line 39 of this embodiment will be described in detail. Hereinbelow, the description will be given about the resistance variable film 38 and the word line 39 which are disposed in the −X direction with respect to the local bit line 37. For the description of the resistance variable film 38 and the word line 39 disposed in the +X direction with respect to the local bit line 37, "+X direction" and "−X direction" in the description below may be reversed.

First, the resistance variable film 38 will be described.

Figure 2:
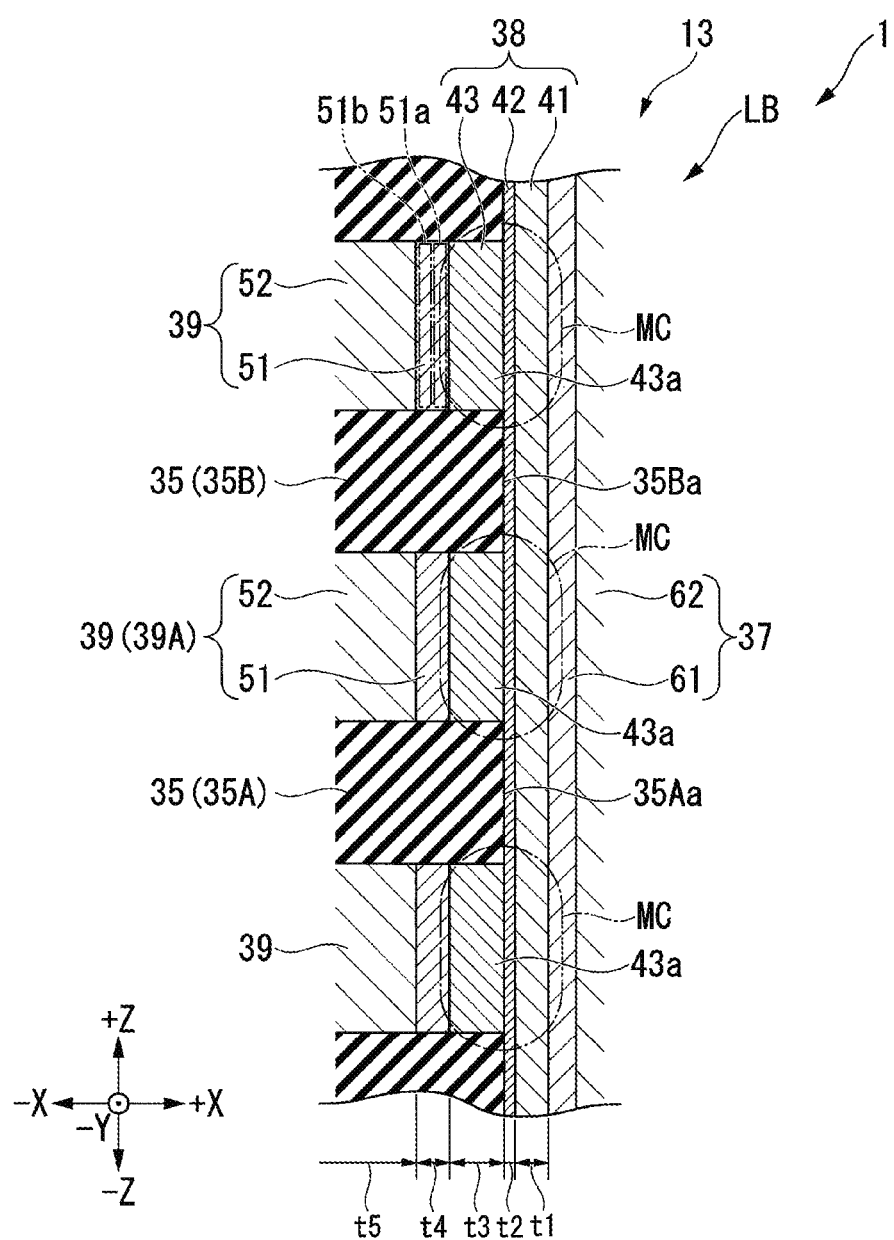
FIG. 2 is a cross-sectional view taken along a line II-II of the storage device illustrated in FIG. 1.

FIG. 2 is a cross-sectional view taken along a line II-II of the storage device 1 illustrated in FIG. 1. The resistance variable film 38 includes, for example, a barrier layer 41, an interfacial reaction suppression layer 42, and a high conductivity layer 43. The barrier layer 41 is an example of each of the "first layer" and a "first conductive layer". The high conductivity layer 43 is an example of each of the "second layer" and a "second conductive layer". The interfacial reaction suppression layer 42 is an example of a "third layer". The "conductive layer" in this specification is a layer which conducts the current when a predetermined condition is satisfied, and means a layer which is provided with the intention of current conduction. The high conductivity layer 43 may be called an "oxygen deficient layer". The interfacial reaction suppression layer 42 may be called an "interfacial layer".

In this embodiment, the barrier layer 41, the interfacial reaction suppression layer 42, and the high conductivity layer 43 are arranged in this order from the local bit line 37 toward the word line 39. In other words, the interfacial reaction suppression layer 42 is located closer to the word line 39 than the barrier layer 41. The high conductivity layer 43 is located closer to the word line 39 than the interfacial reaction suppression layer 42. In other words, the high conductivity layer 43 is located on a side opposite to the local bit line 37 in the X direction with respect to the barrier layer 41. The interfacial reaction suppression layer 42 is located in the X direction between the barrier layer 41 and the high conductivity layer 43.

The barrier layer 41 has a non-linear conductivity. The barrier layer 41 faces the local bit line 37 in the +X direction. In this embodiment, the barrier layer 41 abuts on the local bit line 37. The barrier layer 41 is formed over the entire surface in the −X direction of the corresponding local bit line 37, for example. In this embodiment, the barrier layer 41 continuously extends in the Z direction in the stacked body LB, and faces the plurality of word lines 39 and the plurality of interlayer insulating films 35 which are stacked in the Z direction.

The barrier layer 41 is formed of a material of which the bandgap is relatively wide and the conductivity is low. As such a material, for example, amorphous silicon (aSi) is used in the barrier layer 41. Further, the barrier layer 41 may be formed of a silicon nitride (SiN), an aluminum oxide (AlO), a silicon oxide (SiO), a hafnium oxide (HfO), a zirconium oxide (ZrO), and silicates and aluminates of these components. The barrier layer 41 may be a stacked film formed of the plurality of materials described above.

The interfacial reaction suppression layer 42 is formed over the entire surface in the −X direction of the barrier layer 41, for example. In this embodiment, the interfacial reaction suppression layer 42 continuously extends in the Z direction in the stacked body LB, and faces the plurality of word lines 39 and the plurality of interlayer insulating films 35 which are stacked in the Z direction. The interfacial reaction suppression layer 42 inhibits the reaction between the barrier layer 41 and the high conductivity layer 43 when the current flows through the resistance variable film 38. Further, since the interfacial reaction suppression layer 42 is sufficiently thin, the current is passed by a tunnel effect at the time of driving the memory cell MC.

The interfacial reaction suppression layer 42 is formed of an insulating material (for example, an aluminum oxide (AlO), a silicon oxide (SiO), a silicon nitride (SiN), or a stacked film of these materials), for example. The electrical resistivity of the interfacial reaction suppression layer 42 is higher than that of the barrier layer 41, and higher than that of the high conductivity layer 43. A thickness t2 of the interfacial reaction suppression layer 42 in the X direction is thin compared to a thickness t1 of the barrier layer 41 in the X direction, and thin compared to a thickness t3 of the high conductivity layer 43 in the X direction. Further, herein, the thickness t1 of the barrier layer 41 is from the interface between the local bit line 37 and the barrier layer 41 up to the interface between the interfacial reaction suppression layer 42 and the barrier layer 41. The thickness t2 of the interfacial reaction suppression layer 42 is from the interface between the barrier layer 41 and the interfacial reaction suppression layer 42 up to the interface between a high conductivity layer 43 and the interfacial reaction suppression layer 42.

The high conductivity layer 43 is formed only in a region facing the plurality of word lines 39 in the surface in the −X direction of the interfacial reaction suppression layer 42, for example. In other words, the high conductivity layer 43 includes a plurality of conductive portions 43a, each of which abuts on the word line 39. The plurality of conductive portions 43a is located between the plurality of interlayer insulating films 35 separated from each other in the Z direction.

The high conductivity layer 43 is formed of a transition metal oxide, and contains oxygen. The high conductivity layer 43 is formed of a material of which the bandgap is narrow compared to the barrier layer 41 and the conductivity is high compared to the barrier layer 41. In the high conductivity layer 43, an oxygen vacancy may be formed due to oxygen deficiency. The state of oxygen deficiency (the state of oxygen vacancy) in the high conductivity layer 43 varies by applying a voltage. As such a material, for example, a titanium oxide (TiO) is used for the high conductivity layer 43. As another expression, the high conductivity layer 43 contains an oxide of a first metal. An example of the first metal is "titanium". However, the first metal is not limited to the above example. In addition, the high conductivity layer 43 may be formed to be continuous over the entire surface in the −X direction of the interfacial reaction suppression layer 42 without being segmented into the plurality of conductive portions 43a. The thickness t3 of the high conductivity layer 43 in the X direction is thick compared to the thickness t1 of the barrier layer 41 in the X direction, for example. However, the thickness t3 of the high conductivity layer 43 is not limited to the above example.

In the resistance variable film 38 having the above configuration, oxygen ions are introduced from the barrier layer 41 to the high conductivity layer 43 by applying a voltage to the resistance variable film 38. Then, the band structure of the resistance variable film 38 varies, and the resistance state varies. Further, the storing operation of the storage device 1 will be described in detail below.

Next, the word line 39 will be described.

The word line 39 includes the connection portion 51 and a wiring portion 52. The connection portion 51 is an example of the "first portion". The connection portion 51 may be called an "electrode". The wiring portion 52 is an example of the "second portion". The wiring portion 52 may be called a "body portion".

The connection portion 51 is provided at the end in the +X direction in the word line 39, and abuts on the high conductivity layer 43. In this embodiment, the connection portion 51 abuts on the conductive portion 43a. In this embodiment, the surface in the +X direction in one connection portion 51 abuts onto the surface in the −X direction of one conductive portion 43a corresponding to one connection portion 51 over the entire surface. The connection portion 51 is formed of a material which is the same type of metal as the high conductivity layer 43 and easily oxidized compared to the high conductivity layer 43 (having a large tendency of ionization), for example. With this configuration, at least the surface portion (the region near the high conductivity layer 43) of the connection portion 51 absorbs oxygen from the high conductivity layer 43 at the time when the storage device 1 is manufactured. Therefore, the oxygen content becomes high as compared to the wiring portion 52. Further, the same inspection is performed on the two targets to recognize one of the two targets having a "high oxygen content" on the basis of the measured oxygen amount. In other words, the same inspection is performed on two targets, and one having a high oxygen amount may be recognized as one also having a high oxygen content. On the other hand, the oxygen content of the connection portion 51 is lower than that of the high conductivity layer 43, for example. Therefore, the connection portion 51 easily absorbs oxygen from the high conductivity layer 43 at the time of manufacturing the storage device 1.

In at least one embodiment, the high conductivity layer 43 is formed of a titanium oxide (TiO), and the connection portion 51 is formed of a titanium nitride (TiN) as a base material. In other words, the high conductivity layer 43 contains a nitride of the first metal. The high conductivity layer 43 is formed of, for example, a titanium-rich material (a material of which a titanium proportion occupying the composition of the material exceeds 50%), and easily absorbs oxygen from the high conductivity layer 43. In this embodiment, a composition ratio of nitrogen and titanium in the connection portion 51 (nitrogen:titanium) is larger than 1:1, and smaller than 1:9, for example.

The connection portion 51 includes, for example, a first region 51a and a second region 51b. The first region 51a is closer to the high conductivity layer 43 than the wiring portion 52. For example, the first region 51a includes the end surface in the +X direction in the connection portion 51, and abuts on the high conductivity layer 43 (the conductive portion 43a). The second region 51b is located between the first region 51a and the wiring portion 52 in the X direction. Then, the oxygen content of the first region 51a is higher than the oxygen content of the second region 51b. In at least one embodiment, the oxygen content varies continuously between the first region 51a and the second region 51b. In other words, in the connection portion 51, the oxygen content is gradually lowered as it is separated from the high conductivity layer 43.

In at least one embodiment, a thickness t4 of the connection portion 51 in the X direction is thin compared to the thickness t3 of the high conductivity layer 43 in the X direction, for example. In addition, the thickness t4 of the connection portion 51 in the X direction is thicker than the thickness t2 of the interfacial reaction suppression layer 42 in the X direction, for example. However, the thickness t4 of the connection portion 51 is not limited to the above example. For example, the thickness t4 of the connection portion 51 may be almost the same as the thickness t3 of the high conductivity layer 43, or may be thicker than the thickness t3 of the high conductivity layer 43.

In at least one embodiment, the connection portion 51 is located between the plurality of interlayer insulating films 35 in the Z direction. Herein, a word line 39A of the plurality of word lines 39 will be taken up as a representative, and the surrounding configuration thereof will be described. The plurality of interlayer insulating films 35 includes a first interlayer insulating film 35A which is overlapped with the connection portion 51 and the wiring portion 52 of the word line 39A in the −Z direction, and a second interlayer insulating film 35B which is overlapped with the connection portion 51 and the wiring portion 52 of the word line 39A in the +Z direction. In other words, the word line 39 is provided between the first interlayer insulating film 35A and the second interlayer insulating film 35B. The first interlayer insulating film 35A is an example of a "first insulating film". The second interlayer insulating film 35B is an example of a "second insulating film". A dimension of the connection portion 51 in the Z direction is almost the same as the distance between the first interlayer insulating film 35A and the second interlayer insulating film 35B.

In at least one embodiment, the first interlayer insulating film 35A includes an edge 35Aa which faces the barrier layer 41 of the resistance variable film 38. The second interlayer insulating film 35B includes an edge 35Ba which faces the barrier layer 41 of the resistance variable film 38. Then, the connection portion 51 is located in the −X direction from the local bit line 37 with respect to the edge 35Aa of the first interlayer insulating film 35A and the edge 35Ba of the second interlayer insulating film 35B. In other words, the connection portion 51 is separated in the −X direction from the barrier layer 41 of the resistance variable film 38 compared to the edge 35Aa of the first interlayer insulating film 35A and the edge 35Ba of the second interlayer insulating film 35B. With this configuration, a step exists between the connection portion 51, and the edge 35Aa of the first interlayer insulating film 35A and the edge 35Ba of the second interlayer insulating film 35B. Then, the conductive portion 43a of the high conductivity layer 43 is provided in the step.

The wiring portion 52 is separated from the resistance variable film 38 compared to the connection portion 51. The wiring portion 52 forms a remaining portion of the word line 39 excluding the connection portion 51, for example. The wiring portion 52 is formed of a material of which the electrical resistivity is lower than that of the connection portion 51, for example (for example, tungsten (W)). As another expression, the wiring portion 52 is formed of a second metal which is different from the first metal contained in the high conductivity layer 43 and the connection portion 51. For example, the wiring portion 52 does substantially not contain oxygen. In this specification, the expression "substantially not contain oxygen" is not limited to a case where oxygen is not contained at all. Minute oxygen may exist as impurities at the time of manufacturing. In this embodiment, a thickness t5 of the wiring portion 52 in the X direction is thick compared to the thickness t4 of the connection portion 51 in the X direction.

However, the thicknesses of the connection portion 51 and the wiring portion 52 in the X direction are not limited to the above example. In the word line 39, the electrical resistance of the entire word line 39 is lowered as the wiring portion 52 in the X direction is made thicker. On the other hand, the word line 39 may increase the oxygen amount (limit amount) in the connection portion 51 as the connection portion 51 in the X direction is made thicker.

Next, the local bit line 37 will be described.

The local bit line 37 includes a connection portion 61 and a wiring portion 62 similarly to the word line 39, for example. The connection portion 61 may be called an "electrode". The wiring portion 62 may be called a "body portion".

The connection portion 61 abuts on the barrier layer 41. The wiring portion 62 is located on a side opposite to the resistance variable film 38 with respect to the connection portion 61 in the X direction. The connection portion 61 and the wiring portion 62 extend in the Z direction, for example. Further, the local bit line 37 may be formed only by the wiring portion 62. In this case, the wiring portion 62 may be called an "electrode".

Subsequently, a manufacturing method of the storage unit 13 will be described. FIGS. 3 to 10 are cross-sectional views illustrating the manufacturing method of the storage unit 13. The storage unit 13 is manufactured by flattening the surface in the +Z direction of the insulating film between the plurality of silicon members 21 and the plurality of silicon members 21 (hereinafter, referred to as a film deposition surface 100) by CMP (Chemical Mechanical Polishing), and then using the following method, for example. Further, the film deposition surface 100 is not limited to the surface of the silicon member 21. When a contact is provided as the connection member between the silicon member 21 and the local bit line 37, the upper surface of the contact becomes the film deposition surface 100. The "contact" means a conductive connection member of a columnar shape or a reversed frusto-conical shape extending in the Z direction.

Figure 3:
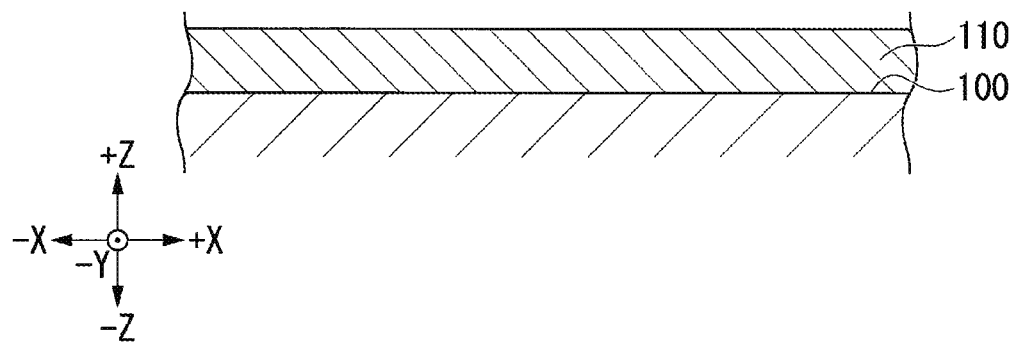
FIG. 3 is a cross-sectional view illustrating a manufacturing method of a storage unit according to at least one embodiment.
Figure 4:
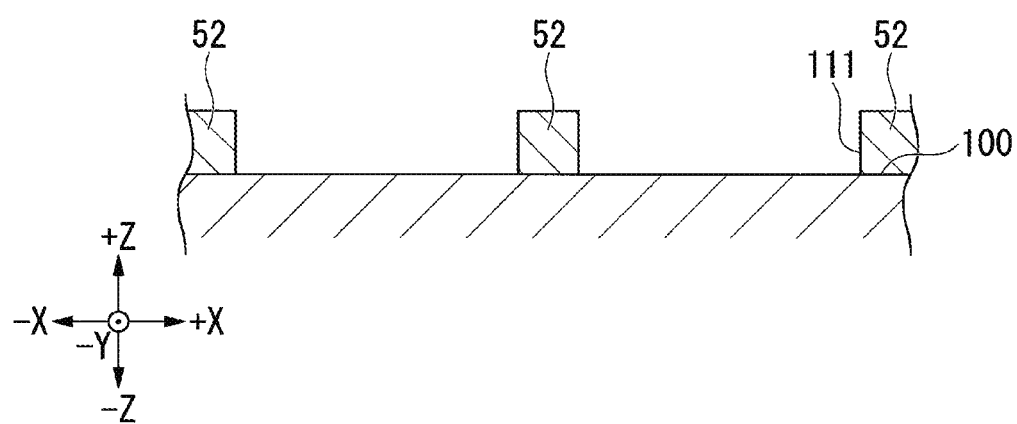
FIG. 4 is a cross-sectional view illustrating the manufacturing method of the storage unit according to at least one embodiment.

First, as illustrated in FIG. 3, a first conductive layer 110 is deposited on the film deposition surface 100. The first conductive layer 110 is a conductive layer which becomes the wiring portion 52 of the word line 39 in the subsequent procedure. The first conductive layer 110 is formed by, for example, CVD (Chemical Vapor Deposition). Then, as illustrated in FIG. 4, the first conductive layer 110 is subjected to etching (for example, RIE (Reactive Ion Etching)) to remove the first conductive layer 110 other than the forming region of the wiring portion 52. With this configuration, a plurality of wiring portions 52 are formed, and a groove 111 is formed between two wiring portions 52 adjacent in the X direction.

Figure 5:
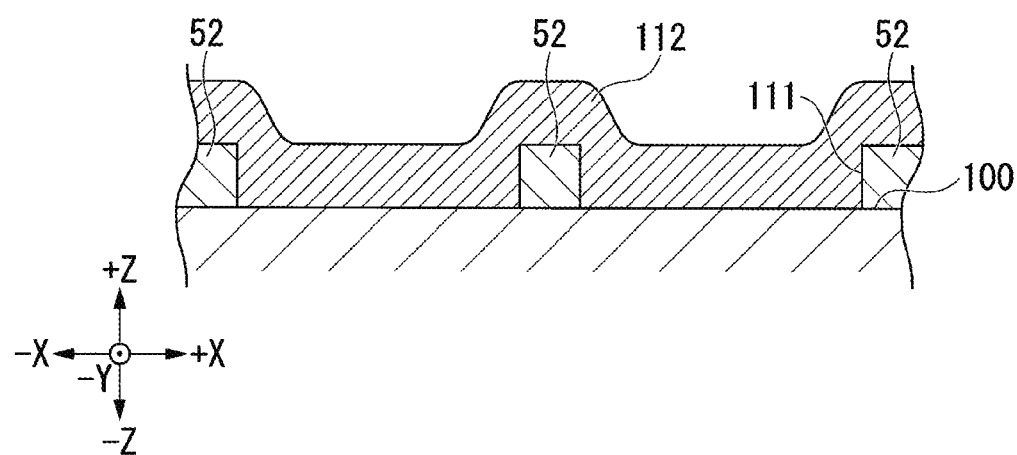
FIG. 5 is a cross-sectional view illustrating the manufacturing method of the storage unit according to at least one embodiment.
Figure 6:
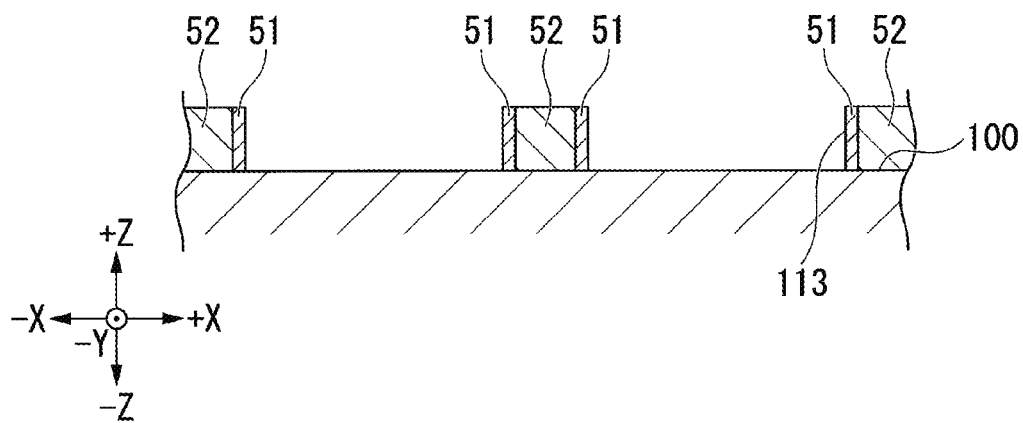
FIG. 6 is a cross-sectional view illustrating the manufacturing method of the storage unit according to at least one embodiment.

Subsequently, as illustrated in FIG. 5, for example, a second conductive layer 112 is formed in the groove 111 and on the wiring portion 52. The second conductive layer 112 is a conductive layer which becomes the connection portion 51 of the word line 39 in the subsequent procedure. Then, as illustrated in FIG. 6, the second conductive layer 112 is subjected to etching to remove the second conductive layer 112 other than the forming region of the connection portion 51. With this configuration, a plurality of connection portions 51 are formed, and a groove 113 is formed between two connection portions 51 adjacent in the X direction. Further, a composition ratio of a titanium nitride forming the connection portion 51 may be adjusted by a flow rate (supply amount) of a nitrogen gas which is introduced at the time of depositing the second conductive layer 112, for example.

Figure 7:
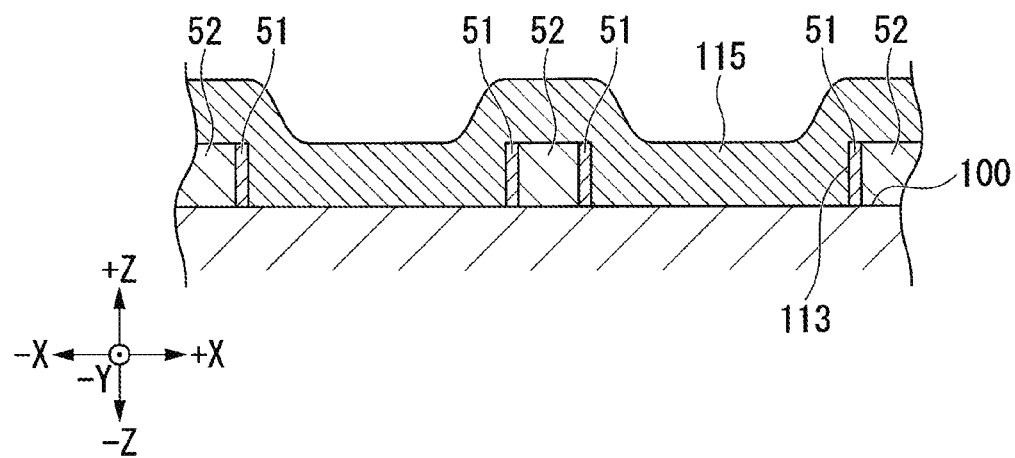
FIG. 7 is a cross-sectional view illustrating the manufacturing method of the storage unit according to at least one embodiment.

Then, as illustrated in FIG. 7, for example, a third conductive layer 115 is formed in the groove 113, and on the wiring portion 52 and the connection portion 51. The third conductive layer 115 is a conductive layer which becomes the high conductivity layer 43 of the resistance variable film 38 in the subsequent procedure. Then, the third conductive layer 115 is subjected to etching to leave the third conductive layer 115 only in the groove 113. With this configuration, a first intermediate body 101 is formed.

Herein, in the forming procedure of the third conductive layer 115, titanium is deposited while the oxidizing gas is introduced into the chamber where the storage device 1 is housed during the manufacturing. Therefore, the third conductive layer 115 made of a titanium oxide is formed. At that moment, part of the oxygen contained in the third conductive layer 115 is absorbed by the connection portion 51 of the word line 39 from the third conductive layer 115. With this configuration, the oxygen deficient amount of the third conductive layer 115 (the high conductivity layer 43) becomes large compared to a case where the connection portion 51 is not provided.

Further, the deposition order of the first conductive layer 110, the second conductive layer 112, and the third conductive layer 115 is not limited to the above example, and may be appropriately changed. For example, when the second conductive layer 112 is deposited after the high conductivity layer 43 is formed, the oxygen contained in the high conductivity layer 43 is absorbed into the second conductive layer 112 (to be oxidized) by an influence of heat generated at the time of depositing the second conductive layer 112. Therefore, the oxygen deficient amount of the high conductivity layer 43 may be increased.

Figure 8:
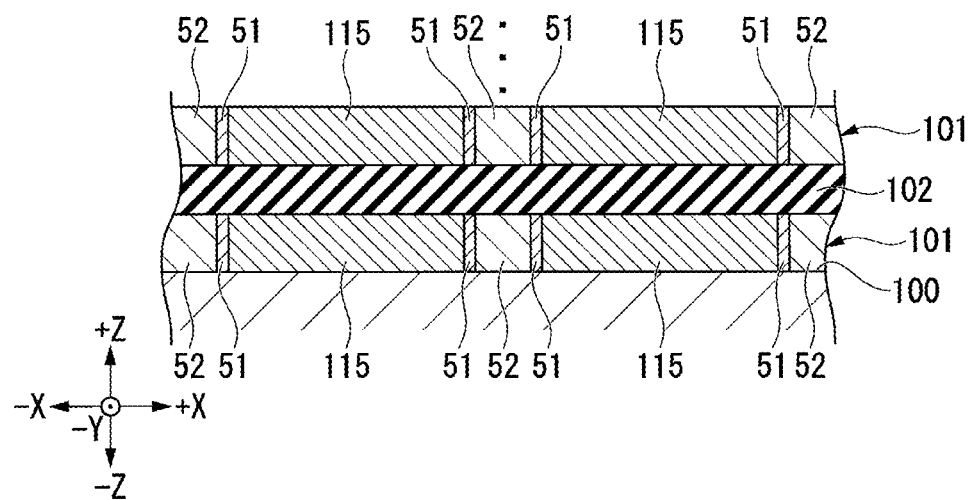
FIG. 8 is a cross-sectional view illustrating the manufacturing method of the storage unit according to at least one embodiment.
Figure 9:
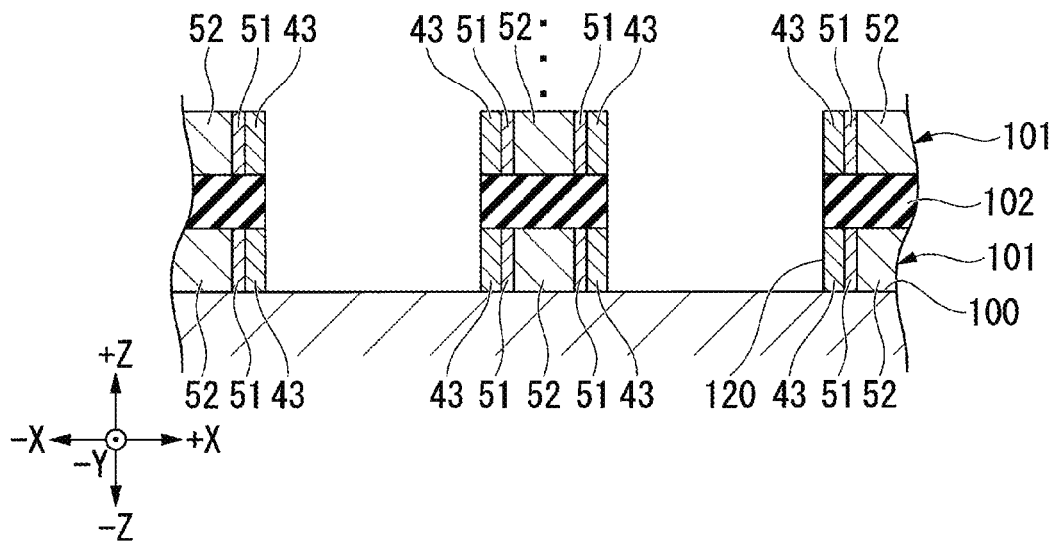
FIG. 9 is a cross-sectional view illustrating the manufacturing method of the storage unit according to at least one embodiment.

Subsequently, as illustrated in FIG. 8, the first intermediate body 101 is repeatedly formed while interposing an insulating layer 102 therebetween. Subsequently, as illustrated in FIG. 9, the center portion of the third conductive layer 115 in the X direction is subjected to the etching. With this configuration, a groove 120 is formed to cut the first intermediate body 101 and the insulating layer 102 in the Z direction. With this configuration, the high conductivity layer 43 and the interlayer insulating film 35 are formed.

Figure 10:
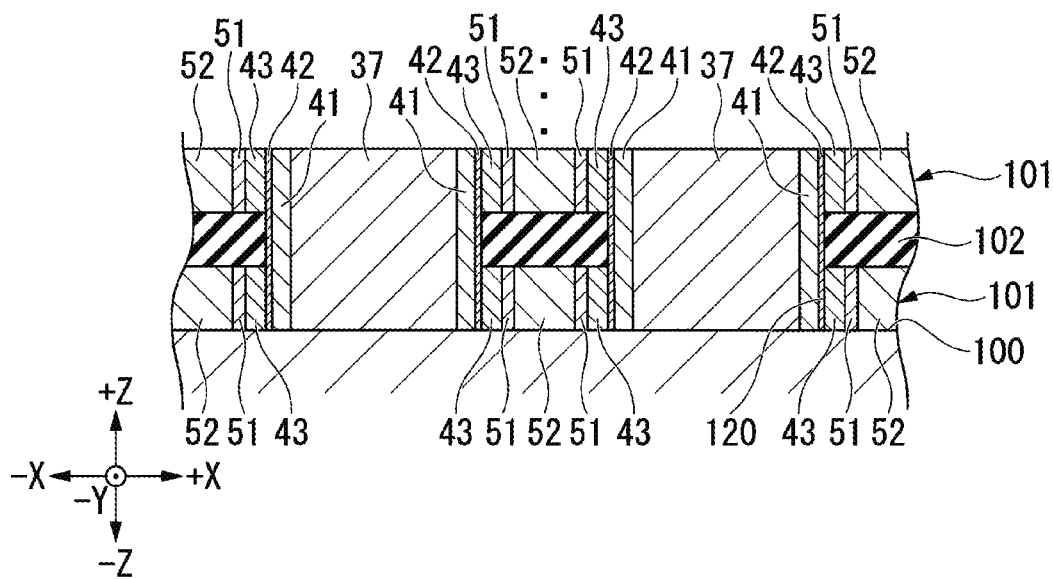
FIG. 10 is a cross-sectional view illustrating the manufacturing method of the storage unit according to at least one embodiment.

Then, as illustrated in FIG. 10, the interfacial reaction suppression layer 42, the barrier layer 41, and the local bit line 37 are formed in the groove 120. With this configuration, the storage unit 13 is formed.

Next, the storing operation of the storage device 1 will be described.

The storage device 1 of this embodiment changes a distribution of the oxygen deficient place in the memory cell MC of the high conductivity layer 43 by applying a voltage to the memory cell MC to be operated. With this configuration, an electrical resistance of the selected memory cell MC varies. For example, the memory cell MC includes at least two resistance states such as a high resistance state and a low resistance state.

The high resistance state is a state in which the oxygen deficiency (oxygen vacancy) in a region near the barrier layer 41 in the high conductivity layer 43 is less. On the other hand, the low resistance state is a state where the amount of the oxygen deficiency in a region near the barrier layer 41 in the high conductivity layer 43 is large compared to the high resistance state. In the following, the high resistance state may be referred to as a "reset state", and the low resistance state may be referred to as a "set state". In addition, an operation of shifting to the reset state may be referred to as a "reset operation", and an operation of shifting to the set state may be referred to as a "set operation".

When the memory cell MC is in the reset operation, a voltage is applied to the memory cell MC such that a potential of the local bit line 37 is lower than the potential of the word line 39. O atoms in the barrier layer 41 or the interfacial reaction suppression layer 42 move toward the high conductivity layer 43 as Ox ions (negative charges) due to the electric field generated at that moment. As a result, the oxygen deficiency of the region near the barrier layer 41 in the high conductivity layer 43 is canceled by combining with the oxygen ions. With this configuration, the memory cell MC enters the reset state. In general, a voltage necessary for the memory cell MC to enter the reset operation is higher than a voltage necessary for the memory cell MC to enter the set operation.

On the other hand, a voltage at which the potential of the word line 39 becomes lower than the potential of the local bit line 37 is applied to the memory cell MC in order to cause the memory cell MC to enter the set operation. With the electric field generated at that moment, the negatively charged Ox ions are pulled back to the barrier layer 41 or the interfacial reaction suppression layer 42 from the high conductivity layer 43 side. As a result, the amount of the oxygen deficiency in the high conductivity layer 43 becomes large. With this configuration, the memory cell MC enters the set state.

According to the storage device 1 of the above configuration, it is possible to save power. In other words, in at least one embodiment, the word line 39 includes the connection portion 51 which abuts on the high conductivity layer 43 and absorbs the oxygen from the high conductivity layer 43 at the time of manufacturing the storage device 1. According to such a configuration, it is possible to reduce the oxygen amount of the entire high conductivity layer 43 compared to a case where the connection portion 51 is not provided. With this configuration, it is possible to lower the resistance value at the time of setting the high conductivity layer 43. On the other hand, the resistance value at the time of resetting is generated by the reduction of the oxygen deficiency in the region near the barrier layer 41 in the high conductivity layer 43. Therefore, there is no essential influence of the connection portion 51. With the above configuration, it is possible to make a difference in resistance value at the time of setting and resetting large by increasing the oxygen deficiency of the high conductivity layer 43. Further, it is possible to lower the voltage required for the operation. With this configuration, it is possible to save power in the storage device 1.

In this embodiment, the high conductivity layer 43 includes a titanium oxide. The connection portion 51 contains a titanium nitride. According to such a configuration, the high conductivity layer 43 and the connection portion 51 are formed of the same kind of metal, as the main component. Therefore, the oxygen easily moves from the high conductivity layer 43 to the connection portion 51 at the time of manufacturing the storage device 1. With this configuration, it is possible to effectively lower the oxygen content of the high conductivity layer 43. Further, a contact portion (the connection portion 51) of the word line 39 to the high conductivity layer 43 is formed of the same kind of metal as the high conductivity layer 43. Therefore, the adhesiveness between the word line 39 and the high conductivity layer 43 is easily secured.

In at least one embodiment, in the composition ratio of nitrogen and titanium in the connection portion 51 (nitrogen: titanium), the ratio of titanium to nitrogen is larger than 1:1. According to such a configuration, a ratio of titanium introduced into the chamber is easily secured at the time of depositing the connection portion 51. Therefore, it is possible to more simply deposit the connection portion 51 without complicated settings of a deposition condition.

In at least one embodiment, in the composition ratio of nitrogen and titanium in the connection portion 51 (nitrogen: titanium), the ratio of titanium to nitrogen is smaller than 1:9. According to such a configuration, the oxygen can be absorbed from the high conductivity layer 43 to the connection portion 51, and the breakdown withstand voltage of the connection portion 51 can be secured to be equal to or higher than a predetermined level.

In at least one embodiment, the word line 39 includes the wiring portion 52 having the electrical resistivity which is almost equal to or lower than that of the connection portion 51. According to such a configuration, for example, the electrical resistance of the entire word line 39 can be reduced as compared to a case where the entire word line 39 is formed of the material of the connection portion 51. With this configuration, it is possible to save more power in the storage device 1.

In at least one embodiment, the connection portion 51 is provided at a position (that is, a deep place from the edge 35Aa of the first interlayer insulating film 35A) more separated from the barrier layer 41 of the resistance variable film 38 than the edge 35Aa of the first interlayer insulating film 35A in the X direction. Therefore, between the first interlayer insulating film 35A and the second interlayer insulating film 35B, the high conductivity layer 43 (the plurality of conductive portions 43a) is disposed for each word line 39. With this configuration, it is possible to prevent a leakage current from flowing through the high conductivity layer 43 between the word lines 39 adjacent in the Z direction. As a result, the disturbance between the memory cells MC can be effectively prevented, and further power saving can also be achieved.

Second Embodiment

Next, a second embodiment will be described. The second embodiment is different from the first embodiment in that the entire word line 39 is formed of the same kind of metal, as a base material. Further, the configurations other than those described below are similar to those of the first embodiment.

Figure 11:
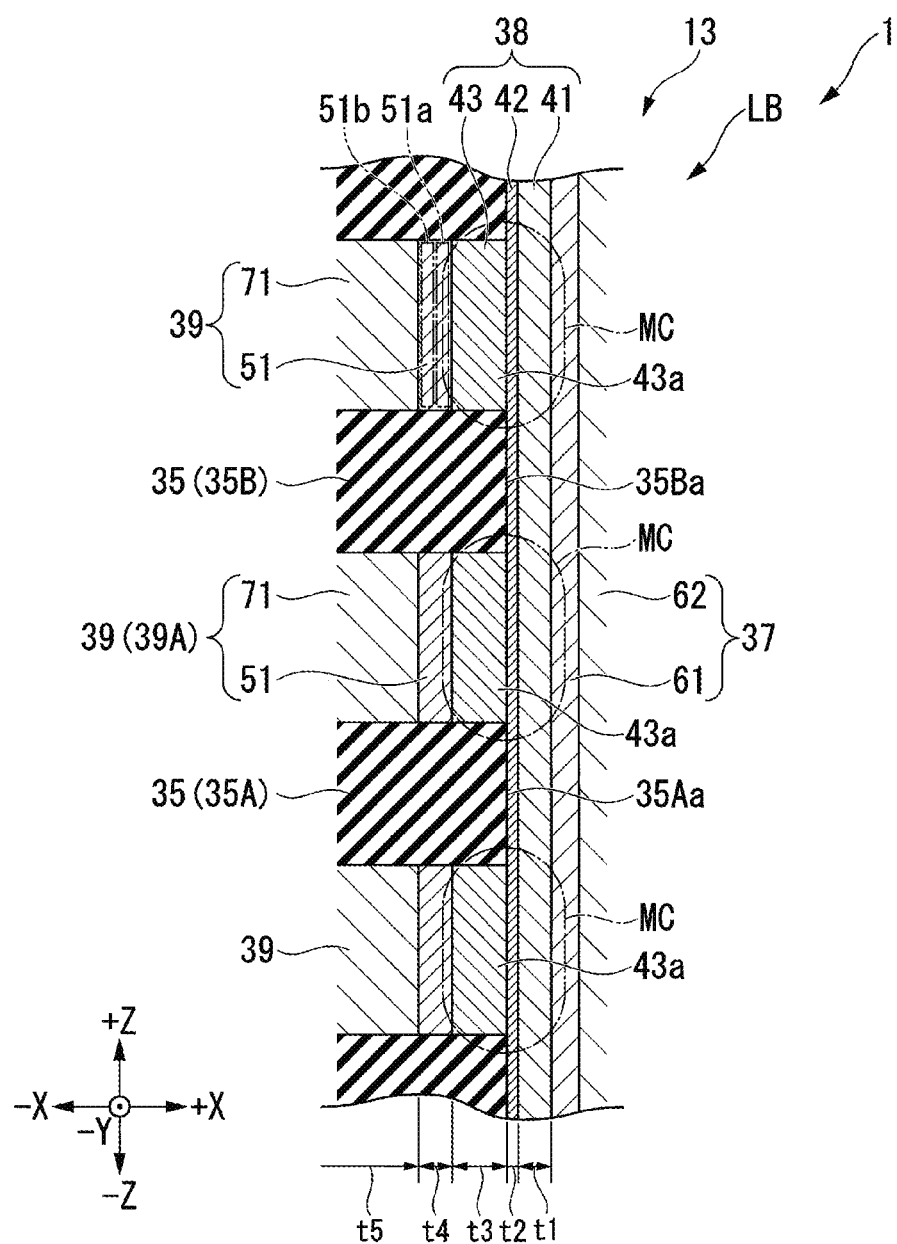
FIG. 11 is a cross-sectional view illustrating an ambient configuration of a memory cell of a storage device according to at least one embodiment.

FIG. 11 is a cross-sectional view illustrating an ambient configuration of the memory cell MC of the storage device 1 in the second embodiment. In this embodiment, the word line 39 includes the connection portion 51 and a wiring portion 71. The wiring portion 71 is an example of a "second portion". The wiring portion 71 may be called a "body portion".

The wiring portion 71 corresponds to the wiring portion 52 of the first embodiment. However, in at least one embodiment, the wiring portion 71 contains the same kind of metal (for example, titanium) as the first metal contained in the high conductivity layer 43 and the connection portion 51. For example, the wiring portion 71 is formed of a titanium nitride (TiN). For example, the wiring portion 71 substantially does not contain oxygen. Even in this embodiment, the connection portion 51 absorbs the oxygen from the high conductivity layer 43 at the time of manufacturing the storage device 1, for example. Therefore, the oxygen content becomes high compared to the wiring portion 71. Even in such a configuration, it is possible to save power in the storage device 1 similarly to the first embodiment.

Hitherto, while several embodiments are described, the embodiments are not limited to the above examples. For example, the resistance variable film 38 may be adjacent to the surface in the +Y direction and the surface of the −Y direction B of the local bit line 37.

According to at least one of the embodiments described above, the second conductor of the storage device includes a first portion which abuts on the second layer of the resistance variable film, and a second portion which is separated from the resistance variable film compared to the first portion. The oxygen content of the first portion is higher than that of the second portion. According to such a configuration, it is possible to provide a storage device which can save power.

Hereinbelow, some storage devices will be noted additionally.

[1] A storage device, includes
a first conductor layer,
a second conductor layer which includes a first portion and a second portion, and
a resistance variable film which includes a first layer and a second layer, the first layer being provided between the first conductor layer and the second conductor layer, and the second layer being provided between the first layer and the first portion, containing oxygen, and having a conductivity higher than that of the first layer,
in which the oxygen content of the first portion is higher than the oxygen content of the second portion.

[2] In the storage device according to [1],
the first layer is a barrier layer which has a non-linear conductivity.

[3] In the storage device according to [1],
the second layer contains an oxide of a first metal, and
the first portion contains a nitride of the first metal.

[4] In the storage device according to [1],
the second layer contains a titanium oxide, and
the first portion contains a titanium nitride.

[5] In the storage device according to [4],
in a composition ratio of nitrogen and titanium in the first portion, the amount of titanium is larger than that of nitrogen.

[6] In the storage device according to [4],
a composition ratio of nitrogen and titanium in the first portion is larger than 1:1 and smaller than 1:9.

[7] In the storage device according to [1],
the second layer contains an oxide of a first metal,
the first portion contains a nitride of the first metal, and
the second portion contains a second metal different from the first metal.

[8] In the storage device according to [7],
the first metal is titanium, and
the second metal is tungsten.

[9] In the storage device according to [7],
the second metal is a material having a low electrical resistivity compared to the first metal.

[10] In the storage device according to [9],
a dimension of the first portion in a first direction from the first portion toward the resistance variable film is smaller than a thickness of the second layer in the first direction.

[11] In the storage device according to [1],
the resistance variable film is located between the first layer and the second layer, and includes a third layer of which the electrical resistivity is higher than those of the first layer and the second layer, and
a dimension of the first portion in a first direction from the first portion toward the resistance variable film is thicker than a thickness of the third layer in the first direction.

[12] In the storage device according to [1],
the oxygen content of the first portion is lower than an oxygen content of the second layer.

[13] In the storage device according to [1],
the first portion includes a first region which is closer to the second layer than the second portion, and a second region which is located between the first region and the second portion, and
the oxygen content of the first region is higher than the oxygen content of the second region.

[14] In the storage device according to [13],
the oxygen content continuously varies between the first region and the second region.

[15] The storage device according to [1], further includes a stacked body in which a plurality of insulating films and a plurality of second conductor layers containing the second conductor layer are alternately stacked,
in which the second layer includes a plurality of conductive portions which are separated from each other and located between the plurality of insulating films, and
the first portion abuts on one conductive portion of the plurality of conductive portions.

[16] In the storage device according to [15],
the second layer is segmented into the plurality of conductive portions.

[17] In the storage device according to [15],
each of the plurality of second conductor layers includes the first portion and the second portion.

In the storage device according to [15],
the plurality of insulating films includes a first insulating film which is overlapped with the second conductor layer in a second direction intersecting with a first direction from the first portion toward the resistance variable film,
the first insulating film includes a first edge which faces the first layer, and
the first portion is located to be separated from the first layer than the first edge of the first insulating film in the first direction.

[19] In the storage device according to [15],
the plurality of insulating films includes a first insulating film which is overlapped with the second conductor layer in a second direction intersecting with a first direction from the first portion toward the resistance variable film, and a second insulating film which is located on a side opposite to the first insulating film with respect to the second conductor layer, and
a dimension of the first portion in the second direction is almost the same as a distance between the first insulating film and the second insulating film in the second direction.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:
1. A storage device, comprising:
a first conductor;
a resistance variable film which includes a first layer and a second layer, the second layer being located on a side opposite to the first conductor with respect to the first layer, including oxygen, and having a conductivity higher than a conductivity of the first layer; and
a second conductor which includes a first portion abutting on the second layer of the resistance variable film and a second portion separated from the resistance variable film by the first portion, the first portion having a higher oxygen content than an oxygen content of the second portion.

2. The storage device according to claim 1, wherein
the second layer contains an oxide of a first metal, and
the first portion contains a nitride of the first metal.

3. The storage device according to claim 1, wherein
the second layer contains titanium oxide, and
the first portion contains titanium nitride.

4. The storage device according to claim 2, wherein
the second layer contains titanium oxide, and
the first portion contains titanium nitride.

5. The storage device according to claim 3, wherein
a composition ratio of nitrogen and titanium in the first portion is larger than 1:1 and smaller than 1:9.

6. The storage device according to claim 1, wherein
the second layer contains an oxide of a first metal,
the first portion contains a nitride of the first metal, and
the second portion includes a second metal which is different from the first metal.

7. The storage device according to claim 6, wherein
the first metal is titanium, and
the second metal is tungsten.

8. The storage device according to claim 6, wherein
the second metal is a material having a lower electrical resistivity than that of the first metal.

9. The storage device according to claim 8, wherein a thickness of the first portion in a first direction from the first portion toward the resistance variable film is smaller than a thickness of the second layer in the first direction.

10. The storage device according to claim 1, wherein the first layer is a barrier layer which has a non-linear conductivity.

11. The storage device according to claim 3, wherein, an amount of titanium is larger than that of nitrogen in a composition ratio of nitrogen and titanium in the first portion.

12. The storage device according to claim 1, wherein
the resistance variable film is located between the first layer and the second layer, and includes a third layer which has an electrical resistivity higher than those of the first layer and the second layer, and
a thickness of the first portion in a first direction from the first portion toward the resistance variable film is larger than a thickness of the third layer in the first direction.

13. The storage device according to claim 1, wherein
an oxygen content of the first portion is lower than an oxygen content of the second layer.

14. The storage device according to claim 1, wherein
the first portion includes a first region which is closer to the second layer than the second portion, and a second region which is located between the first region and the second portion, and
an oxygen content of the first region is higher than an oxygen content of the second region.

15. The storage device according to claim 14, wherein
the oxygen content continuously varies between the first region and the second region.

16. The storage device according to claim 1, further comprising
a stacked body in which a plurality of insulating films and a plurality of second conductor layers containing the second conductor layer are alternately stacked,
wherein the second layer includes a plurality of conductive portions which are separated from each other and located between the plurality of insulating films, and
the first portion abuts on one conductive portion of the plurality of conductive portions.

17. The storage device according to claim 16, wherein,
the second layer is segmented into the plurality of conductive portions.

18. The storage device according to claim 16, wherein
each of the plurality of second conductor layers includes the first portion and the second portion.

19. The storage device according to claim 16, wherein
the plurality of insulating films includes a first insulating film which is overlapped with the second conductor layer in a second direction intersecting with a first direction from the first portion toward the resistance variable film,
the first insulating film includes a first edge which faces the first layer, and
the first portion is more separated from the first layer than the first edge of the first insulating film in the first direction.

20. The storage device according to claim 16, wherein
the plurality of insulating films includes a first insulating film which is overlapped with the second conductor layer in a second direction intersecting with a first direction from the first portion toward the resistance variable film, and a second insulating film which is located on a side opposite to the first insulating film with respect to the second conductor layer, and
a dimension of the first portion in the second direction is substantially the same as a distance between the first insulating film and the second insulating film in the second direction.

* * * * *